United States Patent [19]

Tanski

[11] 4,237,433

[45] Dec. 2, 1980

[54] SURFACE ACOUSTIC WAVE RESONATORS WITH INTEGRATED INTERNAL COUPLER REFLECTORS

[75] Inventor: William J. Tanski, Maynard, Mass.

[73] Assignee: Sperry Corporation, New York, N.Y.

[21] Appl. No.: 20,115

[22] Filed: Mar. 13, 1979

[51] Int. Cl.³ .................. H03H 9/64; H03H 9/25; H03H 9/145; H01L 41/08
[52] U.S. Cl. .................................. 333/195; 333/196
[58] Field of Search .......................... 333/150–155, 333/193–196; 310/313; 331/107 A

[56] References Cited

U.S. PATENT DOCUMENTS

| | | | |
|---|---|---|---|
| 3,886,504 | 5/1975 | Hartmann et al. | 333/195 |
| 4,130,813 | 12/1978 | Sandy et al. | 333/194 |

FOREIGN PATENT DOCUMENTS 2821748  12/1978  Fed. Rep. of Germany ...... 333/107 A

OTHER PUBLICATIONS

Schulz et al–Surface Acoustic Wave Delay Lines with Small Temperature Coefficient, Proceedings IEEE (USA) vol. 58, No. 9, Sep. 1970; pp. 1361–1362.

Primary Examiner—Marvin L. Nussbaum
Attorney, Agent, or Firm—Howard P. Terry

[57] ABSTRACT

A multiple track acoustic surface wave filter processes input signals successively flowing in coupled resonant acoustic tracks, each track being realized between pairs of surface wave reflectors in the surface of a planar piezoelectric substrate. The acoustic surface wave reflection and coupling devices are at least partially integrated so as to reduce the length of the structure.

7 Claims, 12 Drawing Figures

SURFACE ACOUSTIC WAVE RESONATORS WITH INTEGRATED INTERNAL COUPLER REFLECTORS

BACKGROUND OF THE INVENTION

1. Field of the Invention

The present invention relates generally to acoustic surface wave signal processors employing interacting acoustical means for processing electrical input signals and yielding modified electrical output signals and, more particularly, concerns multiple track acoustic surface wave filters in which a portion of the acoustic energy in adjacent resonant systems is transferred back and forth to form a coupled resonant system.

2. Description of the Prior Art

Prior art acoustic wave filter devices have been realized in several forms. Such devices have been constructed by forming a network of interconnected acoustic transmission lines having substantially parallel tracks on a surface wave substrate, each track being realized between pairs of distributed surface wave reflectors on the surface of a planar piezoelectric element. Standing waves are excited at or are removed from the network by inter-digital electrode devices. Standing waves are coupled between the various resonant tracks by distributed angled arrays of reflector elements and are otherwise confined within the tracks by other reflector arrays.

The prior art, such as the technical paper in the I.E-.E.E. 1976 *Ultrasonics Symposium Proceedings* by R. L. Rosenberg and L. A. Coldren entitled "Reflection-Dependent Coupling Between Grating Resonators", also considers acoustic wave filter devices formed by resonators placed side-by-side and coupled so that power can flow from an input to an output transducer. The coupling is provided by arrays of conductors each aligned parallel to the inter digital fingers of the transducers.

SUMMARY OF THE INVENTION

Preferred embodiments of the present invention are multiple track, high Q, acoustic surface wave filters in which acoustic energy in adjacent resonant channels is transferred back and forth to form a coupled resonant system. According to the invention, the acoustic surface wave reflection and coupling functions are at least partly integrated in such manner as to reduce losses and the significance of undesired multiple resonant modes. Coupled side-by-side resonator channel filters are thus fabricated without the introduction of unwanted resonant modes normally present in devices of excessive length, the reduction in size being additionally beneficial purely on a space saving basis. The invention provides structure making it possible for a significant portion of the surface wave acoustic reflector to function also as a multiple strip coupler, thereby permitting the transfer of a controllable amount of energy from one resonator to the other in a compact structure. Separate and distinct multistrip couplers between resonant channels are no longer necessary. Further, it is no longer necessary to tolerate the presence of unwanted cavity modes due to excessive resonator length; undesired acoustic reflections are also reduced.

DESCRIPTION OF THE PREFERRED EMBODIMENTS

Single-pole, multiport surface wave acoustic filters according to the present invention are constructed by forming resonant acoustic transmission lines between pairs of surface wave reflectors on the surface of a piezoelectric medium. The standing waves may be excited by a conventional surface acoustic wave exciting or wave launching transducer device kindred to that illustrated in FIG. 1. Removal of the surface acoustic wave from the filter for generating a new electrical wave may be accomplished by similar transducer structures, since the reciprocity theorem applies.

Figure 1:
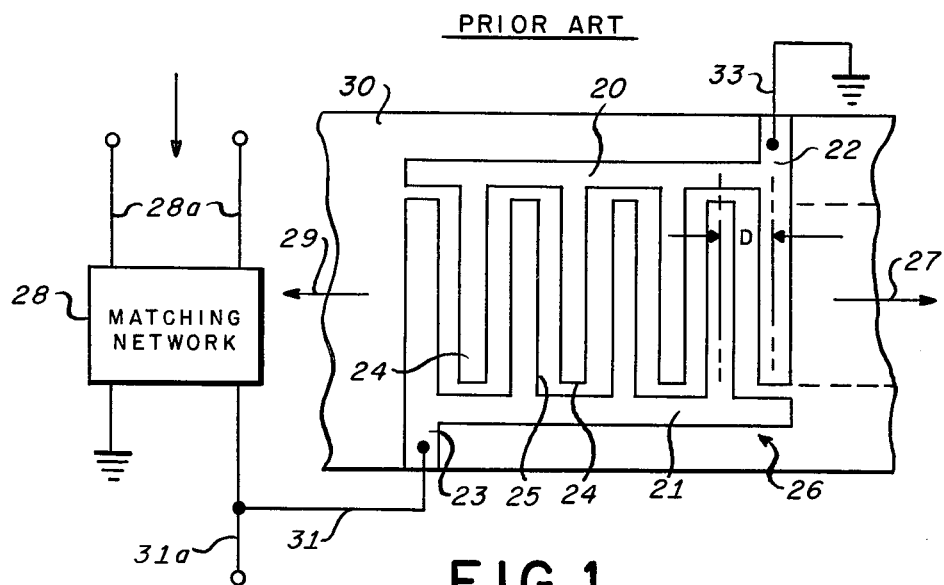
FIG. 1 is a plan view of a prior art acoustic wave launching or acoustic wave receiving device.

While several types of surface acoustic wave exciter and receiver transducers are available in the prior art, one preferred form of the surface wave excitation means is illustrated in FIG. 1 in which the device 26 consists of electrodes 20, 21 with respective interdigital electrode fingers of alternating instantaneous electrical polarity, such as the respective fingers 24, 25. Standard photoetching and photoresist masking or other known techniques may be used to fabricate the thin conductors of interdigital electrodes 20, 21 on substrate 30, which electrodes may be made of aluminum or of other electrically conducting material and may have widths of the order of microns. The device 26 may be formed as a thin overlay on the surface of substrate 30, or preferably is inlayed flush with the surface of substrate 30, as will be further discussed. Adjacent electrode fingers of any one electrode, such as fingers 24 of electrode 20, are spaced one wave length apart at the center of the operating carrier frequency range. The electrode device 26 acts generally as an end fire array, propagating a desired forward surface acoustic wave in the direction indicated by arrow 27 when driven by signals passed through a conventional matching network 28 and via lead 31 from a signal source (not shown) coupled to leads 28a. Since the reciprocity theorem applies, a similarly constructed electrode system will act as a surface acoustic wave receiver, coupling to the traveling electric field associated with the flowing surface elastic wave, and thereby yielding a useful electrical output on lead 31 for signal processing.

In operation, the exciter electrode system 26 of the transducer of FIG. 1, for example, interacts with the quartz or other piezoelectric substrate 30, and will normally produce two oppositely running surface acoustic waves 27, 29 flowing at right angles to the electrode fingers 24, 25. Adjacent fingers of electrodes 20, 21 are preferably spaced apart by an integral number of half wave lengths. The traveling wave is successively increased as it passes under each pair of electrode fingers 24, 25. A receiver electrode system is similarly constituted and operates in the reverse sense to reconvert the acoustic wave into a somewhat delayed electrical output signal. In both cases, it is preferred in the interest of efficiency to space the electrode fingers so that the condition of acoustic synchronism obtains, the traveling electric field at the exciter, for example, having the same periodicity as the electric field normally bound to the acoustic wave. For this condition, D in Finger 1 is one half wave length. It will be recognized that, in practice, the transducer 26 may include many more interdigital fingers than are shown in FIG. 1.

Figure 2:
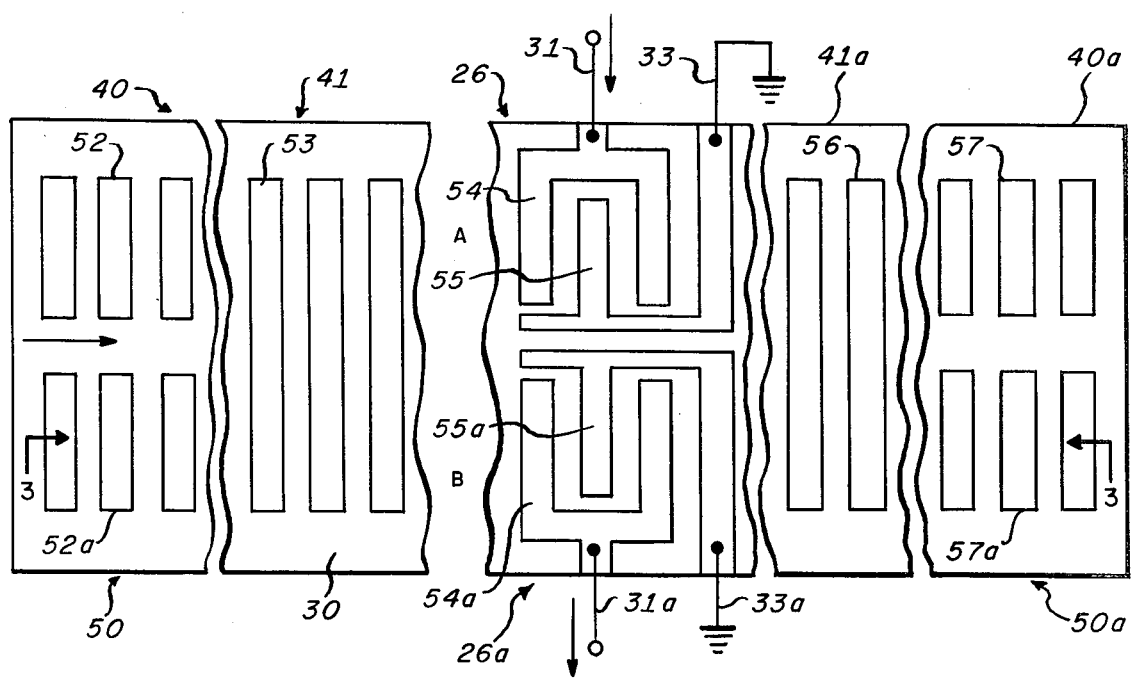
FIG. 2 is a plan view of a dual port, surface wave acoustic filter according to the present invention.
Figure 3:
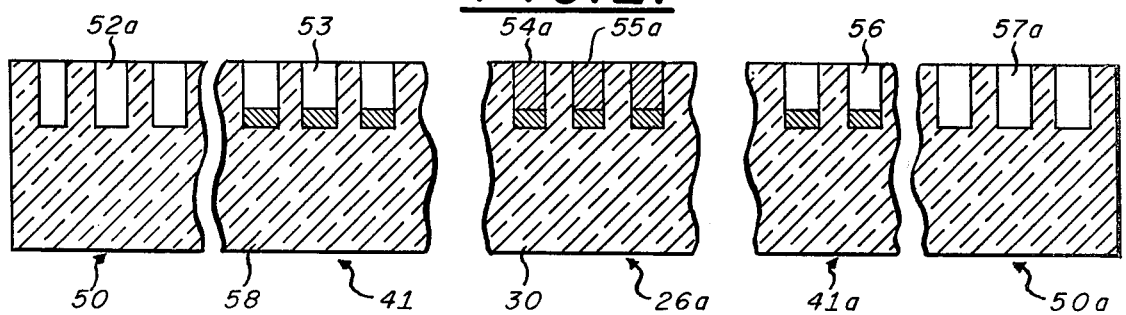
FIG. 3 is a cross section view taken along the line 3—3 of FIG. 2.
Figures 5, 6:
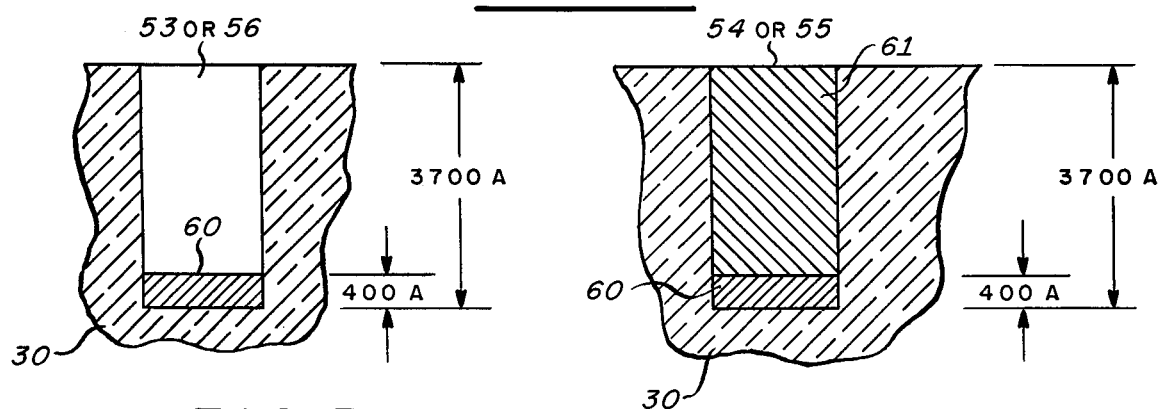
FIGS. 5 and 6 are enlarged cross section views of fragmental portions of FIG. 3.

One symmetric embodiment of the invention is shown in FIGS. 2 and 3, wherein the side-by-side coupled channels A and B include first and second respective transducers 26, 26a placed on an ST cut alpha quartz substrate 30 and which may be used interchangeably as input or output transducers; for purposes of explanation only, transducer 26 will be spoken of herein as an input device, while transducer 26a will serve as the output device. The upper channel A includes a transducer 26 like that of FIG. 1 having a multiplicity of interdigital fingers 54, 55. Matched input signals are coupled via lead 31 to electrodes 54, while electrodes such as electrode 55 are coupled to ground via lead 33. A similar symmetrically disposed output transducer 26a in channel B consists of multiplicities of interdigitial fingers 54a, 55a. Output signals are coupled from electrodes 54a via lead 31a through suitable impedance matching means (not shown), while electrodes such as electrode 55a are again coupled to ground via lead 33a. The recessed metal electrodes as shown in FIGS. 3 and 6 advantageously demonstrate low acoustic reflectivity, a minimum of fabrication problems, and low bulk mode scattering loss.

Symmetrically disposed in channel A on substrate 30 on each side of transducer 26 as seen in FIG. 2 are first portions of multiple element combined channel-coupling and reflector systems 41, 41a, respectively including arrays of coupler-reflector elements 53, 56 extending continuously through channels A and B. The second integrated portions thereof lie also, of course, in channel B and are disposed cooperatively on either side of output transducer 26a. The structure is completed in channel A by symmetrically disposed multi-element reflector systems 40, 40a, each consisting of arrays of respective similar reflector electrodes 52, 57. Companion, but separate, multi-element reflector systems 52a, 57a each similarly consist of arrays of respective similar reflector electrodes 50, 50a.

Figure 4:
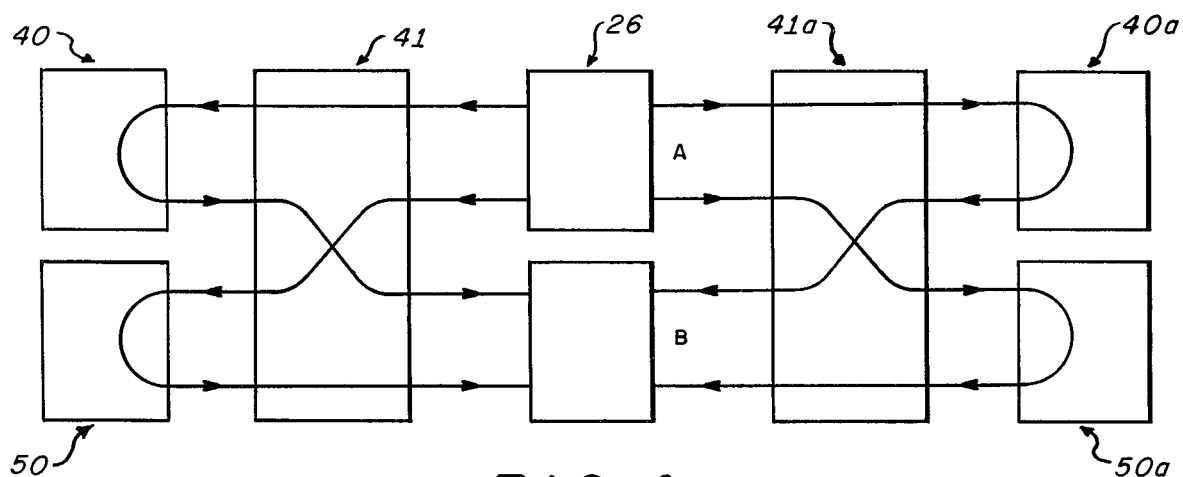
FIG. 4 is a schematic equivalent of FIG. 2 useful in explaining the operation of the invention.

Operation, in general, will be apparent from FIGS. 2 and 4; in the latter, it is shown that signal energy coupled to input transducer 26 in channel A will flow equally in opposite directions to be reflected by reflector arrays 40, 40a, 50, 50a with direct and coupled passage ultimately through the respective coupler-reflectors 41, 41a, finally to be supplied to output transducer 26a.

Referring to FIG. 3, it is seen that elements such as elements 54, 55, 54a, 55a of transducers 26, 26a are formed as regularly disposed grooves, as will be described, within the substrate 30. While the drawings suggest that the grooves are exactly rectangular, such is not strictly necessary. As seen in FIG. 3, the reflector elements 52a, 57a are simply grooves formed in the quartz substrate. These grooves are disposed perpendicular to the surface wave propagation paths, the grooves being formed, for example, by a known ion beam or other etching process. As described by H. S. Tuan and J. P. Parekh et al in "Theory for SAW Grooved Reflector Arrays", *I.E.E.E. Transactions on Sonics and Ultrasonics,* Vol. SU-24, No. 6, pages 384 to 392, November, 1977, and elsewhere, the frequency band and reflectivity of the distributed reflecting array of grooves is determined by such parameters as the spacing between groove centers and the total number and depths of the grooves. For example, by varying the individual depths and the number of the grooves in the array, the effective reflectivities of the distributed arrays 40, 50, 40a, 50a can be varied arbitrarily from less than one per cent of the incident acoustic energy to effectively a totally reflecting one hundred percent, as is employed in the present invention.

Coupling-reflector elements such as elements 53, 56 are formed in the quartz substrate 30 by similar ion beam or other etching processes conveniently at the same time that grooves 52, 52a, 57, 57a are generated. They are completed as shown in detail in FIG. 5 by placing a thin metallic strip 60 on the bottom of the grooves 53 and 56. A chromium film has been used for this purpose and has proven adequate as this medium has the properties desired for use in the coupling-reflector sections 41, 41a, and also because it adheres well to the quartz substrate 30. Furthermore, for purposes yet to be discussed, other electrically conductive metals adhere well to chromium, their simultaneous manufacture being facilitated. In FIG. 5, for example, a uniform 400 Angstrom layer 60 of chromium is placed in one form of the invention on the bottom of a 3700 Angstrom deep groove. Generally, the depths of all of the grooves in the completed structure are the same and the depths are expected to be about one or two percent of the median carrier wave length of the surface acoustic wave. By placing a thin metal film 60 on the bottom of the coupler-reflector grooves, the acoustic reflectivity of their sections 41, 41a is made nearly as high as that of the purely reflective sections 40, 40a.

The transducers 26, 26a represented by the typical fingers 54, 55, are formed generally at the same time as the remainder of the structure. Furthermore, the conducting strips of grooves 53, 56 of the coupler-reflector sections 41, 41a allow the potentials placed on the strips because of the standing resonant wave pattern of the associated resonator to be coupled to the adjacent channel resonator system. The degree of coupling is readily experimentally modified by varying the total number of coupler-reflector strips 53, 56. In practice, the associated grooves are first formed, as described, and (referring to FIG. 6), the inner chromium layer 60 is deposited to a depth, for example, of 400 Angstroms. Next, a thicker layer 61 of an electrical conductor such as aluminum, is deposited, filling the groove. Such a layer may fill the groove flush with the acoustic wave propagating surface, or as in FIG. 6, slightly above that level forming, for example, a 3900 Angstrom deep layer. Gold, silver, and copper adhere well to chromium and may alternatively be used in place of aluminum. Aluminum-filled grooved transducers on quartz desirably have very low acoustic reflectivity.

The invention is particularly advantageous because it readily lends itself to fabrication using a series of individual steps each of which is known separately in the art to be reliable and advantageous. According to the method, the acoustic wave propagation surface is first cleaned using standard processes for such surface acoustic wave substrates. Over the entire wave propagation surface, there is then applied a conventional photoresist or electroresist layer. The desired patterns of grooves at 40, 50, 41, 26, 26a, 41a, 40a, 50a are then developed in the resist layer, defining exposed areas of the substrate 30 for treatment by an ensuing etching process. The etching process, which may use radio frequency sputter etching in a reactive gas such as $CHF_3$, ion beam etching, or other etching processes, is then used to etch all of the grooves to the desired depth, the entire number of grooves being simultaneously formed using the resist as a mask.

After etching, a protective layer of resist is painted over the reflector groove arrays 40, 50, 40a, 50a, to serve as a further mask. With the substrate 30 set up in appropriate apparatus for metal sputtering or for metal evaporation, the thin chromium layer (400 Angstrom thick) is first put down over the entire substrate and on the bottom surfaces of the grooves of coupler-reflectors 41, 41a and of transducers 26, 26a. Next, a further protective layer of resist is painted over the coupler-reflector arrays 41, 41a to serve as a final mask. With the substrate 30 placed in an aluminum sputtering or deposition apparatus, aluminum is deposited over the resist and is particularly formed to a depth in the grooves of transducers 26, 26a about equal to the groove depth minus the chromium thickness. Finally, a conventional metal lift-off process is used to remove from the propagation surface all remaining resist material and all of the metal materials not lying at the base of the etched grooves. The device is cleaned and is ready for mounting for use. Alternatively, chromium and aluminum may be applied in all grooves of the device. Additional, but non-critical masking steps may then be used to etch the chrome and aluminum from the reflectors 40, 50, 40a, 50a and the aluminum only (by a selective etchant) from the coupler sections 41 and 41a.

Figure 7:
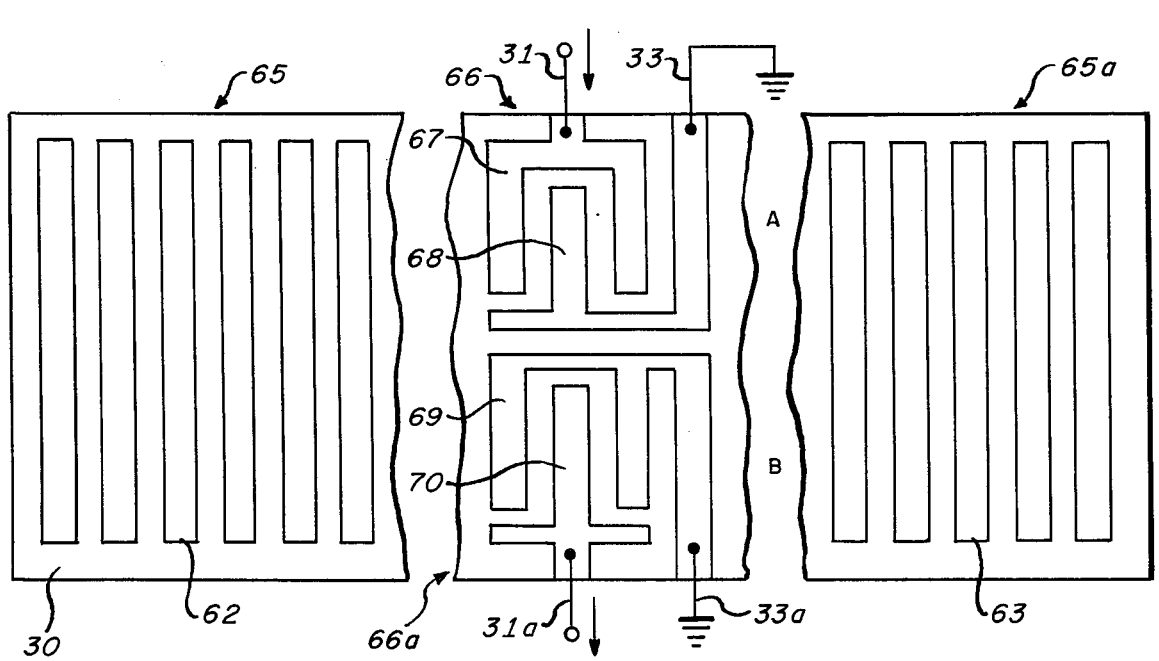
FIG. 7 is a plan view of an alternative form of the invention of FIG. 2.
Figure 8:
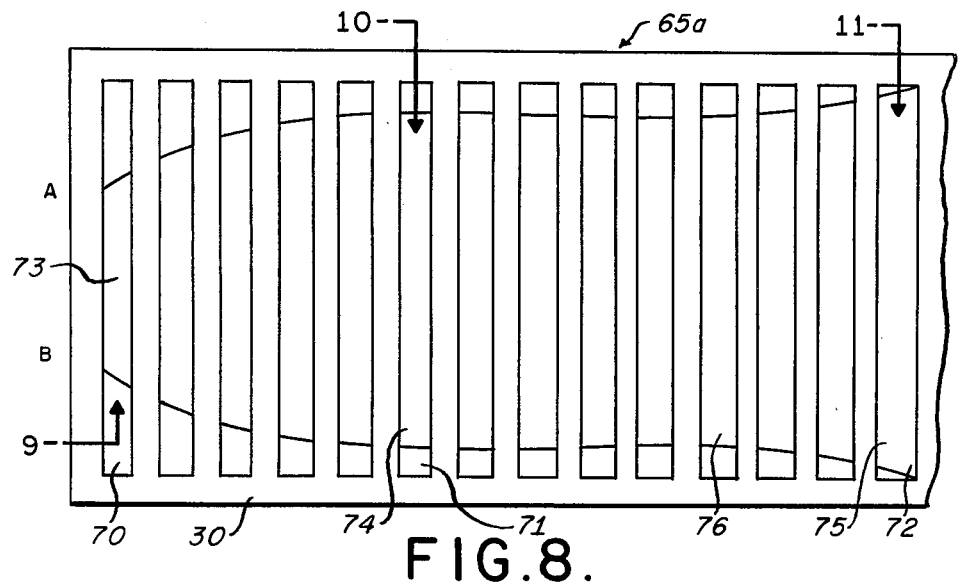
FIG. 8 is a fragmentary plan view of an alternative form of FIG. 7.
Figures 9, 10, 11:
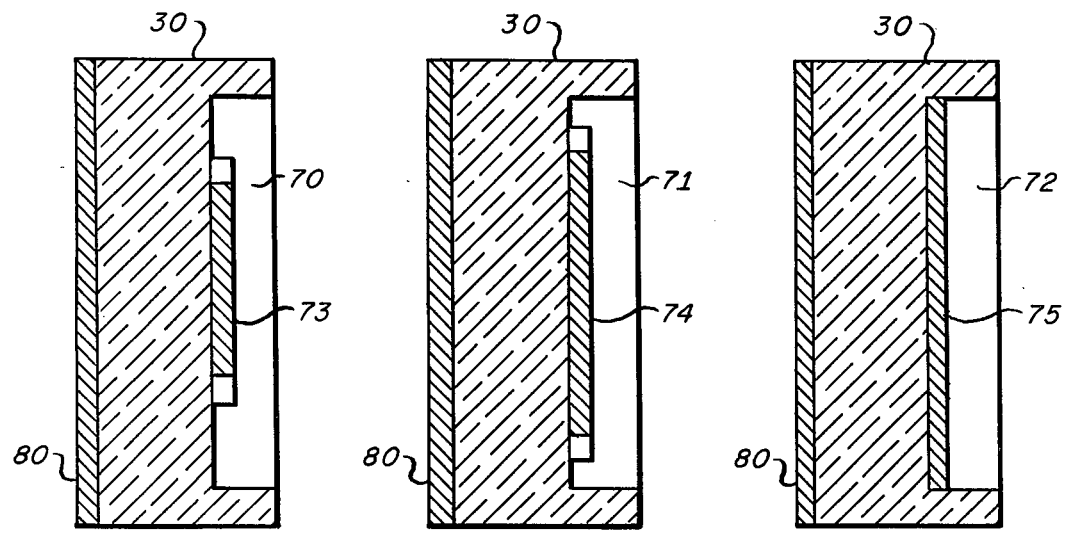
FIGS. 9, 10, and 11 are respective cross section views taken along the lines 9—9, 10—10, and 11—11 of FIG. 9.

The invention may take other forms, as indicated in FIGS. 7 and 8. In FIG. 7, the symmetric device again includes side-by-side coupled channels A and B with first and second respective transducers 66, 66a generally similar in structure and function to the transducers 26, 26a of FIG. 2. The transducers utilize similar respective interdigital electrodes 67, 68 and 69, 70. The structure is completed in channels A and B by a totally integrated coupler-reflector devices 65, 65a extending symmetrically on either side of the transducers 66, 66a. Each elemental groove, such as the respective grooves 62, 63 of coupler-reflectors 65, 65a, has a structure illustrated in cross-section in FIG. 5, containing a thin layer 60 of chromium plated at the bottom of each groove. Each array 65, 65a contains, in one example, 750 grooves with deposited chromium, while the transducer electrodes are like FIG. 6 in structure and may be used in numbers such as 90 elements in each transducer. The widths of the grooves of the coupler-reflector arrays and the separations between adjacent grooves in the example are 5.3 microns. It will be readily apparent to those skilled in the art that manufacture of the device of FIG. 7 may follow a simplified version of that described in connection with the device of FIG. 2 in which unneeded steps are simply omitted.

An improved version of the embodiment of FIG. 7 is shown in FIGS. 8 through 11. Here, the integrated coupler-reflectors 65, 65a of FIG. 7 are replaced by alternative mirror image structures such as the integrated coupler-reflector 65a of FIG. 8. Again, each of the grooves, such as grooves 70, 71, 72, contains thin chromium layers, such as strips 73, 74, 75. However, the layers do not all extend entirely along the length of the grooves, the envelope of the ends of the strips smoothly varying from the short, end strip 73 to the long strip 75 adjacent transducers 66, 66a. Strip 75 essentially fills the total length of groove 72, while strip 73 occupies only a central portion of groove 70. The upper and lower envelopes follow one half of the fundamental transverse resonant mode profile. The weighted configuration advantageously suppresses ripple distortion which may otherwise occur on the high frequency side of the filter response characteristic.

Figure 12:
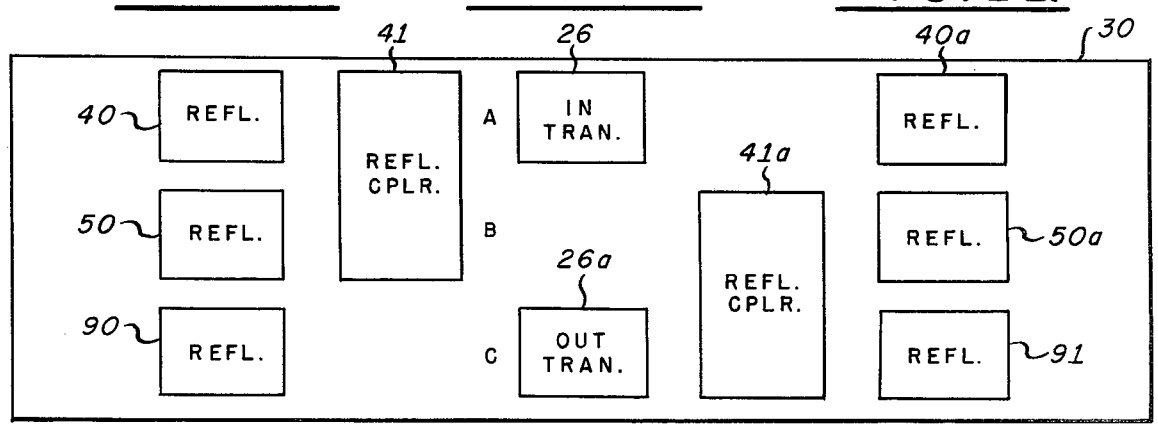
FIG. 12 is a schematic illustration of a further embodiment of the invention.

It will be understood that the principal features of the present invention may be exploited in other configurations, including configurations in which coupling between more than two resonators is advantageously effected. With reference to FIG. 12, three such resonators are disposed on substrate 30 and coupling is effected only on one side of the two outer resonators and on both sides of the central resonator. Input and output transducers 26, 26a are again shown. Channel A includes serially a reflector 40 as previously described, a combined reflector-coupler 41 of the kind previously described and extending into the channel B, the input transducer 26, and reflector 40a like reflector 40. Channel B includes a reflector 50, one end of the coupler-reflector 41, one end of a second similar coupler-reflector 41a, and a reflector 50a. Channel C is like a reversed channel A, including a reflector 90 like reflectors 40 and 50, the output transducer 26a, the second end of coupler-reflector 41a, and a reflector 91 like reflectors 40, 50, and 90. It will be understood by those skilled in the art that the combination reflector-couplers of FIGS. 7 and 8 may be employed in the structure of FIG. 12. The configuration of FIG. 12 permits relatively wide spacing between input transducer 26 and output transducer 26a thus to decrease the direct feedthrough levels advantageously. Moreover, the three-pole filter response characteristic obtained through the use of the embodiment of FIG. 12 provides greater design flexibility than a two-pole structure. It will be appreciated that the embodiment of FIG. 12 can be expanded to include more than three channels thus to provide even greater design flexibility.

Accordingly, it is seen that the invention provides novel arrangements representing improved embodiments overcoming deficiencies of prior art acoustic surface wave filter devices of the kind including a network of interconnected acoustic transmission lines having geometrically parallel resonant channels on a surface wave propagating medium, each channel being realized between cooperating pairs of distributed surface wave reflectors. Acoustic energy propagating in the adjacent resonant channel is transferred by novel coupling arrangements between the two channels; the coupling devices are integrated to serve additionally as acoustic energy reflectors. The acoustic surface wave reflection and coupling devices are at least partially integrated so as to reduce the length of the structure, thus reducing losses and the appearance of undesirable multiple resonant modes. Furthermore, the configuration lends itself to fabrication by the use of simple techniques already well advanced in use in the acoustic surface wave and semiconductor arts and has other advantages as discussed in the foregoing.

While the invention has been described in its preferred embodiments, it is understood that the words which have been used are words of description rather than of limitation and that changes within the purview of the appended claims may be made without departure from the true scope and spirit of the invention in its broader aspects.

What is claimed is:

1. Signal processing apparatus comprising:
substrate means for propagating acoustic waves at a surface thereof,
first transducer means for launching an acoustic wave along a first propagation track at said surface,
second transducer means for receiving an acoustic wave propagating along a second propagating track at said surface and spaced from said first propagation track, and
first and second reflector-coupler means on opposite sides of said first and second transducers means at least in part extending across said first and second propagation tracks for forming coupled first and second respective resonator means,
said reflector-coupler means including a regular array of parallel grooves in said surface disposed at right angles to said first and second propagation tracks, each said parallel groove including a thin metal layer disposed at the bottom thereof, said parallel grooves being of equal length,
said lengths of said thin metal layers varying from a maximum adjacent said first and second transducer means to a minimum at the opposed end of said reflector-coupler means.

2. Apparatus as described in claim 1 wherein said lengths vary progressively as half the fundamental resonant mode profile from said maximum to said minimum length.

3. Signal processing apparatus comprising:
substrate means for propagating acoustic waves at a surface thereof,
first transducer means for launching an acoustic wave along a first propagation track at said surface,
second transducer means for receiving an acoustic wave propagating along a second propagating track at said surface and spaced from said first propagation track, and
first and second reflector-coupler means on opposite sides of said first and second transducer means at least in part extending across said first and second propagation tracks for forming coupled first and second respective resonator means,
said reflector-coupler means including a regular array of parallel grooves in said surface disposed at right angles to said first and second propagation tracks,
said first and second reflector-coupler means comprising:
coupler means comprising a first regular array of parallel grooves in said surface disposed at right angles to said first and second propagation tracks,
first and second separate reflector means spaced from said coupler means opposite said first and second transducer means and comprising second and third regular arrays of parallel grooves in said surface disposed at right angles to said first and second propagation tracks.

4. Apparatus as described in claim 3 wherein said first regular array of parallel grooves consists of grooves including a thin metal layer affixed to the bottoms thereof for facilitating coupling between said first and second propagation tracks.

5. Apparatus as described in claim 4 wherein said thin metal layer is a chromium layer.

6. Apparatus as described in claim 5 wherein said first and second transducer means comprise interdigital electrode means, the cooperating interdigital fingers thereof being disposed substantially perpendicular to said respective first and second propagation tracks.

7. Apparatus as described in claim 6 wherein said cooperating interdigital fingers each include:
a thin layer of chromium disposed at the bottom of a groove in said surface, and
a relatively thicker aluminum layer inlaid within said groove in said substrate and substantially flush with said surface thereof.

* * * * *